(12) United States Patent
Iwamoto et al.

(10) Patent No.: US 6,603,601 B2
(45) Date of Patent: Aug. 5, 2003

(54) INFRARED LASER OPTICAL ELEMENT AND MANUFACTURING METHOD THEREFOR

(75) Inventors: Hiromi Iwamoto, Osaka (JP); Hirokuni Nanba, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 91 days.

(21) Appl. No.: 09/986,133

(22) Filed: Nov. 7, 2001

(65) Prior Publication Data

US 2002/0080843 A1 Jun. 27, 2002

(30) Foreign Application Priority Data

Nov. 14, 2000 (JP) ........................................ 2000-346213

(51) Int. Cl.$^7$ ................................................. F21V 9/04
(52) U.S. Cl. ........................ 359/358; 359/360; 359/359; 359/361; 359/355
(58) Field of Search ................................. 359/358, 359, 359/360, 361, 355, 356, 357, 586, 587, 588, 589, 350

(56) References Cited

U.S. PATENT DOCUMENTS

| | | | | |
|---|---|---|---|---|
| 4,738,497 A | * | 4/1988 | Miyata et al. | 359/601 |
| 5,028,488 A | * | 7/1991 | Nakagawa et al. | 428/457 |
| 5,537,246 A | * | 7/1996 | Sulzbach et al. | 359/359 |
| 5,805,631 A | * | 9/1998 | Xie et al. | 372/68 |
| 6,020,992 A | | 2/2000 | Georgiev et al. | |
| 6,399,228 B1 | * | 6/2002 | Simpson | 428/699 |

OTHER PUBLICATIONS

S. Scaglione et al., "Laser optical coatings produced by ion beam assisted deposition", Film Solid Films, 214 (1992), pp. 188–193.

M. Rahe et al., "The effect of hydrogen concentration in conventional and IAD coatings on the absorption and laser induced damage at 10.6 $\mu$m", Laser–Induced Damage in Optical Materials, SPIE vol. 1848, 1992, pp. 335–348.

Martin Kasper et al., "Characterization of optical thin films for applications at 10.6 micron", Optical Thin Films and Applications, SPIE vol. 1270, 1990, pp. 105–115.

* cited by examiner

*Primary Examiner*—Mohammad Sikder
(74) *Attorney, Agent, or Firm*—McDermott, Will & Emery

(57) ABSTRACT

The present invention provides an infrared laser optical element, in which a dense optical thin film with a low laser absorption and high moisture resistance is formed on the surface thereof, and a manufacturing method for the same. In this infrared laser optical element, the main surface of the optical substrate is smoothed, a $BaF_2$ film formed on said main surface thereof and then a ZnSe film formed on said $BaF_2$ film. The smoothing treatment for the main surface of the optical substrate is carried out by irradiating Xe gas ion beams. The $BaF_2$ and the ZnSe films formed on said $BaF_2$ film are formed on the main surface of the optical substrate, which has been smoothed, by Xe gas ion assisted vapor deposition. Superior performance can be achieved if the series of treatments are carried out under the specified conditions.

5 Claims, 3 Drawing Sheets

INFRARED LASER OPTICAL ELEMENT AND MANUFACTURING METHOD THEREFOR

BACKGROUND OF THE INVENTION

1. Field of the Invention

The present invention generally relates to an infrared laser optical element and a manufacturing method therefor. And more specifically, it relates to an optical coated element such as a focusing lens, window, or the like to be used for an infrared laser applied to machining processes such as a high-power carbon dioxide ($CO_2$) laser, and a manufacturing method therefor.

2. Description of the Related Art

Conventionally, in a processing machine using an infrared laser such as a high-power carbon dioxide laser (emission wavelength: 10.6 $\mu$m), zinc selenide (ZnSe), as being transparent to infrared rays, have been used as a substrate of optical elements for the resonator and focusing systems such as an output coupling mirror, rear mirror, focusing lens and the like. On the other hand, mirrors using silicon (Si) or copper (Cu) as the optical substrate have been used for optical elements of the reflection system.

An optical thin film is coated on the surface of the substrate for these optical elements, whereby the optical elements have desired optical performance. Particularly, in case of an optical element for a carbon dioxide laser, strong energy is supplied to the surface and inside of the optical element due to reflection or transmission of laser light. So thorium fluoride ($ThF_4$) or semiconductor materials such as zinc selenide (ZnSe) and zinc sulphide (ZnS) having low film absorption have been used for materials of the optical thin film to be coated on the surface of the substrate.

Recently, as material processing by a high-power laser has been made practicable, highly accurate and stable processing have been needed, and the necessity has rapidly increased for suppressing the absorption of laser beams by an optical thin film to be coated on optical elements. Under such circumstances, research and development of film manufacturing technology has been carrying out in order to obtain optical thin films for lasers having low laser beam absorption and high durability characteristics.

For example, U.S. Pat. No. 6,020,992 discloses a low-absorption of 0.11 through 0.12 coating film for infrared laser optical elements, that was obtained by laminating a barium fluoride ($BaF_2$) film having a low refractive index and a ZnSe film having a high refractive index, alternately, on a ZnSe substrate.

However, in the coating film disclosed in the above mentioned U.S. Patent, the ZnSe film tend to be easily stripped, as the ZnSe film formed on the uppermost layer is thicker than the $BaF_2$ film in addition, since the $BaF_2$ film has a hygroscopic property, in case where the surface of the ZnSe film is damaged, the $BaF_2$ film easily deteriorates through the damaged portion, so that it becomes difficult to keep the absorption of the entire coating film to be low as an optical element.

Furthermore, if the ZnSe film is thick, the transmittance of spectrum becomes extremely sensitive to the thickness of the ZnSe film at the infrared laser wavelength region. Since the transmittance changes substantially due to a slight difference of the film thickness, it becomes necessary to strictly control the film thickness in the film manufacturing process in order to maintain a desired transmittance. However, it is difficult to control the film thickness so that the anti-reflective function can show a the highest level due to optical spectral characteristics of the coating film. Furthermore, the ZnSe film being thick, it requires a lengthy vapor deposition time for manufacturing the film, and so productivity is low.

Furthermore, an example to improve the the mechanical characteristics of optical coatings for a carbon dioxide laser is mentioned in which a $BaF_2$ and a ZnSe films are deposited on a ZnSe substrate with vapor deposition by means of electron beam heating assisted by xenon (Xe) gas ion beams:

pp. 188–193 of "Laser optical coatings produced by ion assisted deposition", Thin Solid Films, 214 (1992) by S. Scaglione et al.

Moreover, another example is introduced in which a $BaF_2$ film is formed on a ZnSe substrate by argon (Ar) gas ion assisted deposition:

pp. 335–348 of "The effect of hydrogen concentration in conventional and IAD coatings on the absorption and laser induced damage at 10.6 $\mu$m" on pp. 335–348of SPIE Vol. 1848 Laser-Induced Damage in Optical Materials by M. Rache et al., 1992.

However, in these documents, there is no mention of a construction of an infrared laser optical element whose laser beam absorption has been lowered to not more than 0.15%.

SUMMARY OF THE INVENTION

The object of this invention is to provide an infrared laser optical element and a manufacturing method for the same, wherein the laser beam absorption can be lowered to 0.15% at most, and a highly dense and moisture resistant $BaF_2$ film is provided to improve durability.

The infrared laser optical element according to the invention is provided with an optical substrate having a main surface, a $BaF_2$ film formed on said main surface, and a ZnSe film formed on $BaF_2$ film, wherein smoothing treatment is applied on the main surface of the optical substrate.

In the above-mentioned optical element, since the main surface of the optical substrate has been smoothed, a dense $BaF_2$ film can be formed by ion assisted deposition. Therefore, moisture resistance of the $BaF_2$ film is high. Accordingly, even if the thickness of the ZnSe film formed on the $BaF_2$ film is reduced, the optical coating having high durability can be applied on the optical element. As a result, there is minimal deterioration of the $BaF_2$ film even if surface of the uppermost ZnSe layer is damaged, and so the absorption of the entire coating can be maintained to a value as low as 0.15% at most as the optical element.

Furthermore, since the main surface of the optical substrate has been smoothed and so the surface roughness is small, the outer surface of the coated optical element may not be easily stained, nor damaged by laser irradiation in comparison with the case where the surface roughness is large. As a result, an optical element maintaining an excellent appearance can be provided.

The manufacturing method for an infrared laser optical element according to the present invention comprises steps of smoothing the main surface of an optical substrate by irradiating Xe gas ion beams thereon, forming a $BaF_2$ film by Xe gas ion assisted vapor deposition on said smoothed main surface of the substrate, and forming a ZnSe film on said $BaF_2$ film.

By the above-mentioned manufacturing method, a dense $BaF_2$ film can be formed, and therefore, the moisture resistance of the $BaF_2$ film is high, because a $BaF_2$ film is formed by ion beam assisted vapor deposition on the main surface of the substrate which has been smoothed.

DETAILED DESCRIPTION OF THE INVENTION

Figure 1:
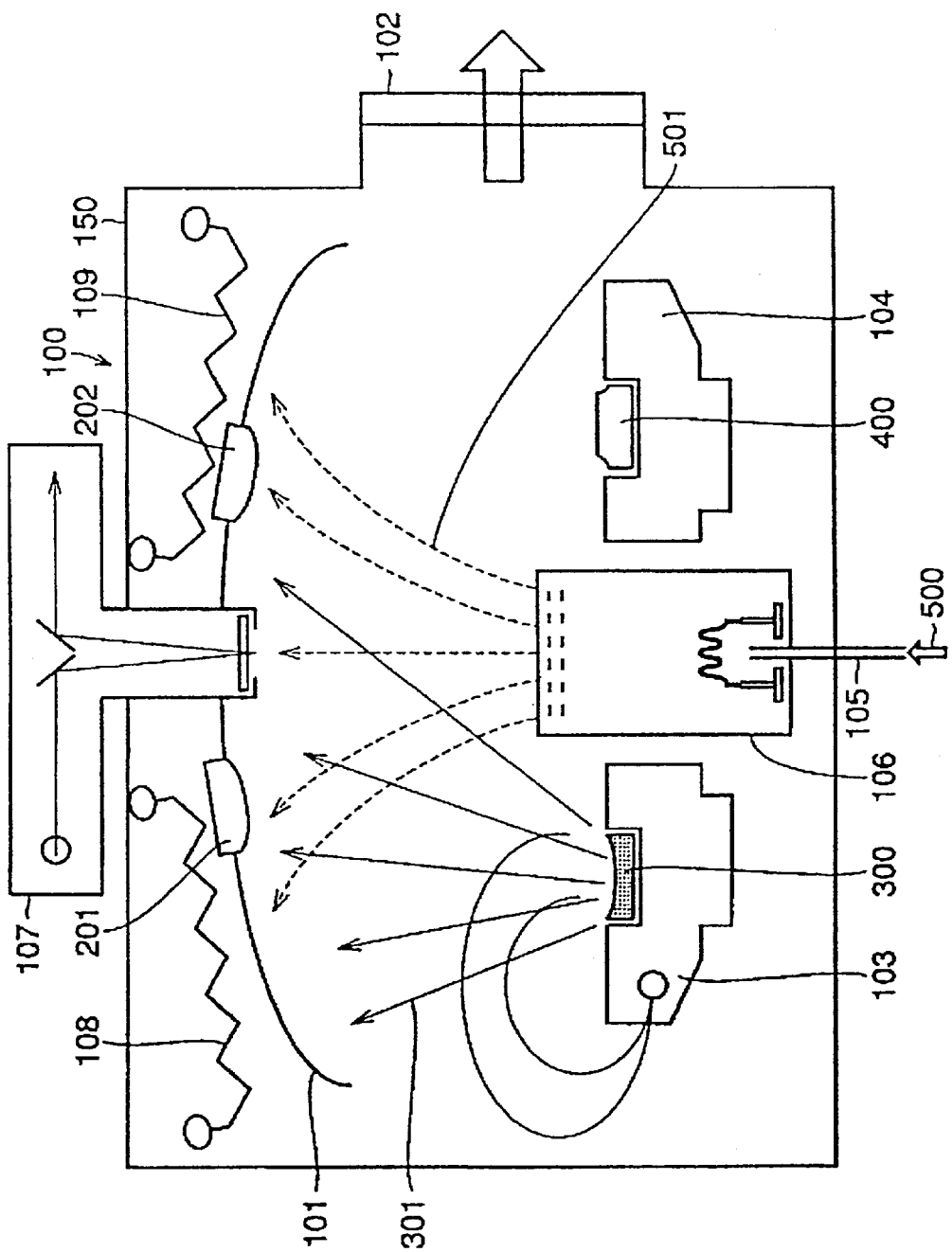
FIG. 1 is a drawing schematically showing the construction of a vapor deposition unit used in Embodiment 1 of the invention.

Inventors of this application studied various ion assisted vapor deposition techniques in order to form a dense $BaF_2$ film on an optical substrate. Then the inventors found that absorption of 0.15% at most could be realized in an infrared laser optical element and the durability of the element could be improved, if the surface of the optical substrate had been smoothed by ion beams and then a $BaF_2$ film formed by ion assisted vapor deposition.

In this optical element of the invention, the optical substrate preferably contains ZnSe, and also absorption thereof for the infrared laser ranges from 0.09% to 0.15% inclusive.

Also preferably, the thickness of the ZnSe film of the optical element of this invention is less than that of the $BaF_2$ film. In case where an optical coating is formed so as to have a double structure consisting of a $BaF_2$ and a ZnSe films on an optical substrate, it is preferable that the above-mentioned relationship of thickness has been satisfied to form an anti-reflective film.

In case where the thickness of the ZnSe film is less than that of the $BaF_2$ film as mentioned above, the peak width of the transmittance of spectrum is large in the wavelength region of the laser beam to be used. As a result, it becomes easy to control the film thickness so that the anti-reflective function can show the highest level as an optical spectral characteristic of the coating, whereby stable transmittance can be obtained.

Furthermore, because of the ZnSe film being thin, the vapor deposition time required for manufacturing the film is short, and so productivity can be improved.

Also, the optical element of the invention preferably includes a multilayered film consisting of a $BaF_2$ and a ZnSe films.

In the manufacturing method for the optical element of the invention, it is preferable that a material containing ZnSe is used for the optical substrate.

In addition, regarding said manufacturing method of the invention, it is preferable that both steps of smoothing the main surface of the optical substrate and forming the $BaF_2$ film are carried out under the condition where the optical substrate is heated at the temperature within the range from 230° C. to 280° C. inclusive.

In the above-mentioned manufacturing method, the thickness of the $BaF_2$ film can be controlled with high accuracy, and a stable transmittance can be obtained, because the temperature of the substrate when forming the $BaF_2$ film is relatively low. In addition, if the temperature of the substrate does not exceed 230° C., crystal growth of the $BaF_2$ film is prevented and so a dense film cannot be formed, and therefore, not only does the film absorption of the infrared laser by the $BaF_2$ film increase, but also the moisture resistance of the film is reduced. If the temperature of the substrate exceeds 280° C., the temperature coefficient of the adhesion rate of the ZnSe film greatly increases. That is, the deposition rate becomes sensitive to the temperature. Therefore, it becomes difficult to control the film thickness, resulting in lowering of transmittance as an optical film.

In the manufacturing method for the optical element of the invention, it is preferable that the step of smoothing the main surface of the optical substrate is carried out by irradiating Xe gas ion beams thereon for 5 to 10 minutes time at an ion beam voltage between 300 V and 800 V inclusive under the condition where the ambient pressure when introducing Xe gas ranges from $5 \times 10^{-3}$ Pa to $3 \times 10^{-2}$ Pa inclusive.

In the step of smoothing the main surface of the optical substrate, if the ambient pressure when introducing Xe gas does not exceed $5 \times 10^{-3}$ Pa, discharge stability for generating Xe ion as an ion source lowers. If the ambient pressure exceeds $3 \times 10^{-2}$ Pa, the content of Xe atoms increases, and then Xe atoms to be taken into the $BaF_2$ film, the film absorption and the film stress increase.

In said step of smoothing the main surface of the optical substrate, if the ion beam voltage does not exceed 300 V, both functions lowers for eliminating materials adhered to the surface of the substrate and for smoothing the surface of said substrate lowers. And as a result, the function for cleaning the surface of said substrate lowers.

Furthermore, if the ion beam voltage exceeds 800 V, an opposite effect is induced whereby the surface of the substrate becomes rough, a phenomenon whereby the surface of the member supporting said substrate being etched increases, and so the surface of the substrate is easily contaminated.

In the step of smoothing the main surface of the substrate, if the ion beam irradiation time is shorter than 5 minutes, the effect of smoothing the surface of said substrate is not sufficient. On the other hand, if the ion beam irradiation time exceeds 10 minutes, as in the case where the ion beam voltage exceeds 800 V, an opposite effect is induced whereby the surface of the substrate becomes rough, and the time required for the film manufacturing process becomes unnecessarily long.

In the manufacturing method for the optical element of the invention, it is preferable that the step of forming the $BaF_2$ film is carried out by irradiating gas ion beams onto the main surface of the optical substrate at an ion beam voltage between 100 V and 200 V under the condition where the ambient pressure when introducing Xe gas ranges from $5 \times 10^{-3}$ Pa to $3 \times 10^{-2}$ Pa inclusive.

The reason for the upper and lower limits of the ambient pressure when introducing Xe gas in the step of forming the $BaF_2$ film is the same as that in the step of smoothing the main surface of the optical substrate.

In the step of forming said $BaF_2$ film, if the ion beam voltage is 100 V at most, it becomes difficult to make the film dense, and adsorbed water or the like is easily mixed into the film. On the other hand, if the ion beam voltage exceeds 200 V, energy provided for molecules to be deposited increases excessively, and the composition of the $BaF_2$ film deviates from the stoichiometry, and so the absorption of the film increases.

In the manufacturing method for the optical element of the invention, it is preferable that the step of forming the $BaF_2$ film is carried out while being irradiated by Xe gas ion beams under the condition where the ion current density is 4 $\mu A/Cm^2$ at least.

In the step of forming the $BaF_2$ film, if the ion current density is less than 4 $\mu A/cm^2$, it becomes difficult to make the film dense, and then adsorbed water or the like is easily mixed into the film.

In the manufacturing method for the optical element of the invention, it is preferable that the step of forming the $BaF_2$ film is carried out with vapor deposition by means of electron beam or resistance heating.

Also, in said method of the invention, it is preferable that the step of forming the ZnSe film is carried out under the condition where the optical substrate is heated at the temperature from 230° C. to 280° C. inclusive.

To simplify the film manufacturing process, it is preferable that the optical substrate is also heated in the ZnSe film forming step at the same temperature as that in the $BaF_2$ film forming step. In the step of forming the ZnSe film, if the temperature of the substrate exceeds 280° C., the temperature dependence of the sticking coefficient of the ZnSe film increases greatly, it becomes difficult to control the film thickness, and so the transmittance as an optical film lowers.

Furthermore, it is preferable that the step of forming the ZnSe film is carried out with vapor deposition by means of electron beam or resistance heating. Moreover, it is preferable that the step of forming the ZnSe film is carried out by ion beam assisted vapor deposition. A ZnSe film obtained by ion assisted vapor deposition is highly dense.

Embodiment 1

A carbon dioxide laser lens comprising an anti-reflective film by forming a $BaF_2$ and a ZnSe films on a lens substrate comprising ZnSe was manufactured with the following process by using vapor deposition unit 100 shown in FIG. 1. As the lens substrate, a plano-convex lens was used, having the focal length of 190.5 mm, edge thickness of 7.87 mm, central thickness of 9.1 mm, and diameter of 50.8 mm.

First, lens substrates 201 and 202 that had been ultrasonically cleaned were attached to a deposition dome 101. A deposition material 300 consisting of granular $BaF_2$ was loaded into an electron beam vapor source 103, and a deposition material 400 of tablet-shaped ZnSe was loaded into an electron beam vapor source 104.

Next, the ambient pressure inside a chamber 150 was set to a predetermined vacuum degree by evacuating gases inside the chamber 150 from exhaust port 102. Then, the lens substrates 201 and 202 were heated at the temperature of 250° C. by using substrate heaters 108 and 109. Then, the deposition dome 101 was rotated. Thereafter, Xe gas 500 was introduced into an ion gun 106 from a gas entrance port 105. Under the condition where the temperature of the lens substrates was maintained at 250° C., the ion gun 106 was set so as to satisfy the determined electric conditions, and Xe gas ion beams 501 were irradiated onto the lens substrates 201 and 202 for 10 minutes from said ion gun 106 at the ion beam voltage of 600 V as shown by dotted arrows, whereby the surfaces of the substrates were cleaned and smoothed. The ambient pressure inside the chamber 150 when introducing the Xe gas was 7.98×10$^{-3}$ Pa.

Thereafter, the ion beam voltage of the ion gun 106 was changed to 200 V. The ion current density was 4 $\mu A/cm^2$.

Simultaneously with such setting, the deposition material 300 of $BaF_2$ was heated by electron beams. Thus, while irradiating Xe gas ion beams 501 under the condition where the temperature of the lens substrates was maintained at 250° C., $BaF_2$ films were formed on the surfaces of the lens substrates 201 and 202 by irradiating $BaF_2$ vapor flows 301 as shown by solid arrows using a vapor deposition method by means of electron beam heating. While monitoring the thicknesses of the $BaF_2$ films with an optical film thickness controller (reflection type optical film thickness monitor) 107, a $BaF_2$ film was formed until up to the thickness of 1.11 $\mu$m. The ambient pressure inside the chamber 150 during the deposition was 7.98×10$^{-3}$ Pa. The deposition rate for the $BaF_2$ film was 0.6 nm/sec.

Subsequent to the formation of the $BaF_2$ film, under the same conditions, a deposition material 400 of ZnSe having been inserted into another electron beam vapor source 104 was heated by electron beams. Then, while maintaining the temperature of the lens substrate at 250° C. and irradiating Xe gas ion beams, ZnSe vapor flows were irradiated with the vapor deposition method by electron beam heating, whereby ZnSe films were formed on the $BaF_2$ films that had been formed on the lens substrates 201 and 202. While monitoring the thickness of the ZnSe film with the optical film thickness controller (reflection type optical film thickness monitor) 107, the ZnSe films were formed up to the thicknesses of 0.20 $\mu$m. The ambient pressure inside the chamber 150 during the deposition was 7.98×10$^{-3}$ Pa. The deposition rate of the ZnSe films was approximately 1.5 nm/sec.

Having finished the manufacturing process of films, the temperature of the lens substrates 201 and 202 was lowered and rotation of the deposition dome 101 was stopped. Then, the lens substrates 201 and 202 having anti-reflective films were taken out from the chamber 150.

Figure 2:
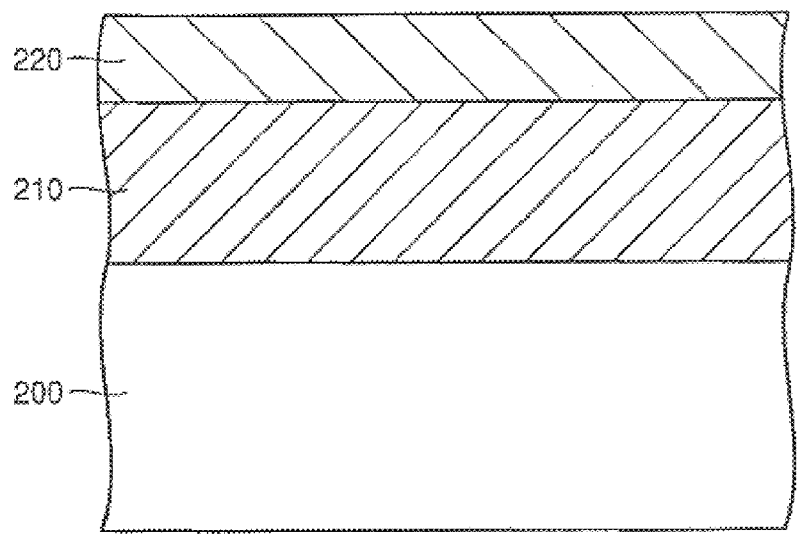
FIG. 2 is a view schematically showing the cross-section of an infrared laser optical element according to the invention.

Thus, as shown in FIG. 2, the $BaF_2$ film 210 and the ZnSe film 220 were formed on the surface of the lens substrate 200 comprising ZnSe.

Figure 3:
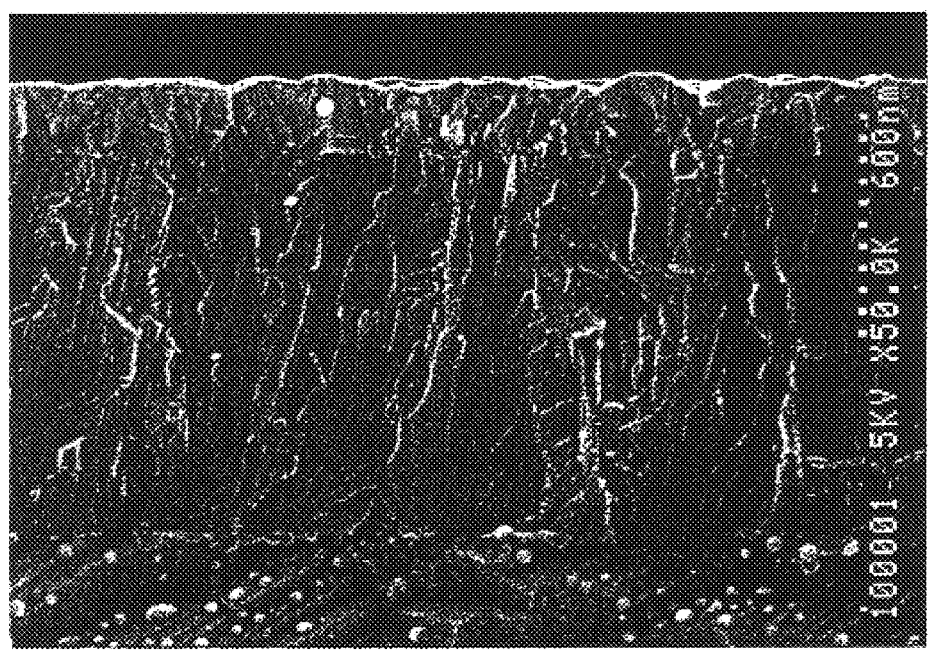
FIG. 3 is a microscopic photograph showing the cross-section of the $BaF_2$ film in a lens manufactured in accordance with the embodiment of the invention.

A cross-section of the $BaF_2$ film observed with a high-resolution scanning electron microscope is shown in FIG. 3. There is no growth of fine crystal grains of $BaF_2$ found in the interface between the substrate and the $BaF_2$ film, but relatively large crystal grains grown on the surface of the substrate were observed.

In the above-mentioned film manufacturing process after smoothing treatment by using ion beams had been finished, the surface of the lens substrate comprising ZnSe was observed with an atomic force microscope and the surface roughness was measured. The difference between the top and the bottom of the convex-concave surface was 30 through 40 nm at maximum. When the outer surface of the ZnSe film of the outermost layer was observed with an atomic force microscope, the surface roughness was 40 through 50 nm using the same measurement as mentioned above.

The absorption (for a carbon dioxide laser) of the lens with the anti-reflective films was measured to be within a the range from 0.11 to 0.13% inclusive. The absorption within this range was also obtained when a ZnSe film was formed with the vapor deposition method by electron beam heating without irradiating Xe gas ion beams. The absorption was measured by using a sample in which anti-reflective films were formed on both surfaces of the lens substrate.

COMPARATIVE EXAMPLE 1

To further clarify the effects of this invention, a lens according to the prior art was manufactured by the following method, and compared with the lens of this invention.

By using the deposition unit 100 shown in FIG. 1, an anti-reflective film was formed on the surface of the lens substrate by a manufacturing process of film, that is different from the above-mentioned embodiment only in the following two points.

(1) Cleaning and smoothing treatment by irradiating Xe gas ion beams onto the lens substrate were not carried out.

(2) A ZnSe film was formed on the surface of the BaF2 film with the vapor deposition method by electron beam heating without irradiating Xe gas ion beam.

Figure 4:
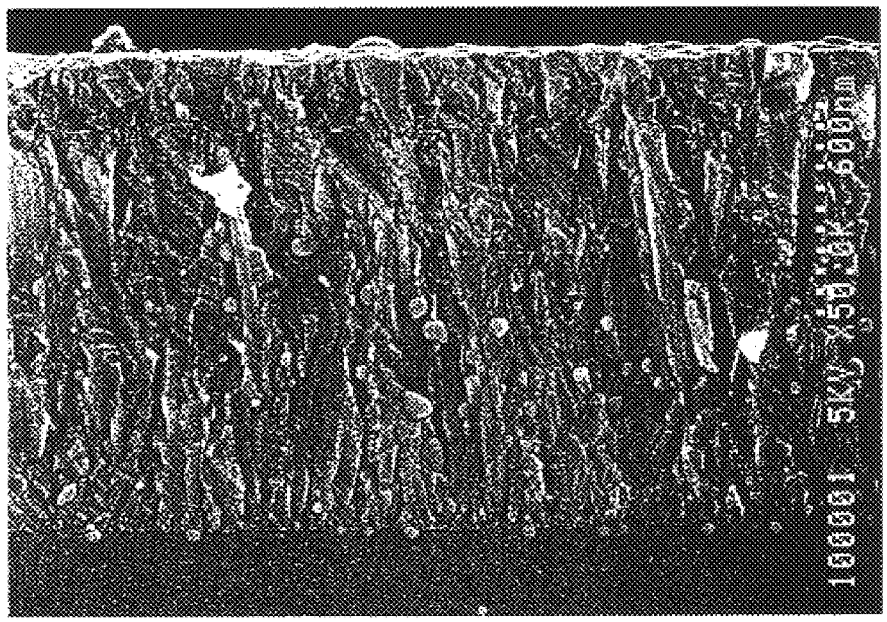
FIG. 4 is a microscopic photograph showing the cross-section of the $BaF_2$ film in a lens manufactured in accordance with the method of Comparative Example 1 described therein; and, FIG. 5 is a microscopic photograph showing the cross-section of the $BaF_2$ film in a lens manufactured in accordance with the method of Comparative Example 2 described therein.

When the cross-section of the $BaF_2$ film was observed with a high-resolution scanning electron microscope, as shown in FIG. 4, the growth of fine crystal grains of $BaF_2$ (crystal grains having the width of approximately 0.06 $\mu$m toward the growing direction) was observed in the interface between the substrate and the $BaF_2$ film.

In addition, in the above-mentioned manufacturing process for the film, while polishing treatment had been applied before manufacturing the film, the surface of the lens substrate comprising ZnSe was observed with an atomic force microscope and the surface roughness was measured. As a result, the difference between the top and bottom of the convexo-concave surface was measured to be 60 through 70 nm at maximum. When the outer surface of the ZnSe film of the outermost layer was observed with an atomic force microscope and the surface roughness was measured, the measured value was 60 through 70 nm using the same measurement method as mentioned above.

When the absorption (for a carbon dioxide laser) of the lens with these anti-reflective films was measured, the value was within the range from 0.23% to 0.25% inclusive. The absorption was measured by using a sample in which anti-reflective films had been formed on both surfaces of the lens substrate.

COMPARATIVE EXAMPLE 2

Furthermore, a lens according to the prior art was prepared by a different method, and compared with the lens of this invention. The points different from the embodiment of the invention are as follows.

(1) Cleaning and smoothing treatment by irradiating Xe gas ion beams onto the lens substrate were not carried out.

(2) A $BaF_2$ and a ZnSe film were formed in order on the surface of the lens substrate with the vapor deposition method by electron beam heating without irradiating Xe gas ion beams.

(3) The ambient pressure inside the chamber 150 during the deposition was set at $1.064 \times 10^{-3}$ Pa.

Figure 5:
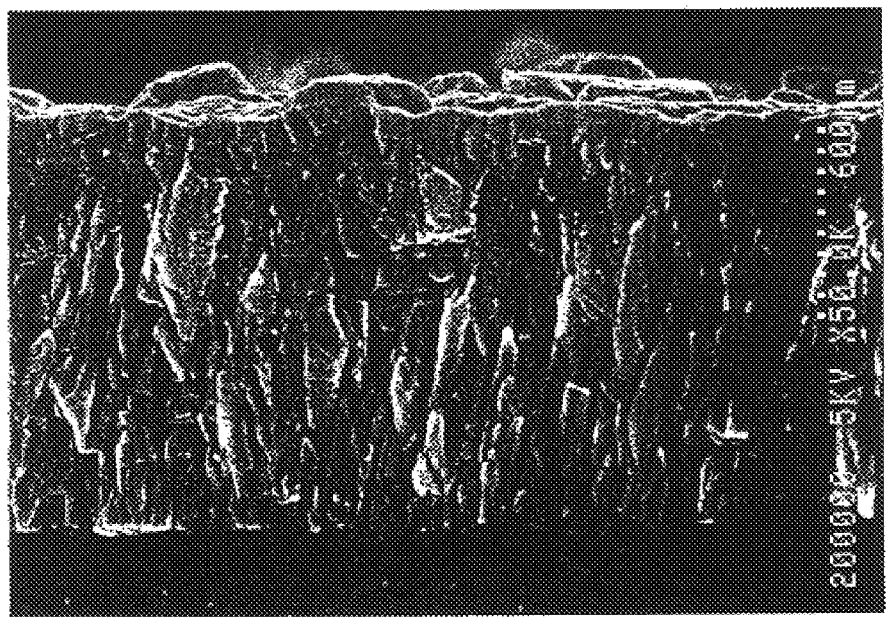

When a cross-section of the $BaF_2$ film was observed with a high-resolution scanning electron microscope, as shown in FIG. 5, the growth of columnar crystals having low filling degree was observed over the entire $BaF_2$ film. In the above-mentioned manufacturing process of the film, under the condition where polishing treatment had been applied before manufacturing the film, when the surface of the lens substrate comprising ZnSe was observed with an atomic force microscope and the surface roughness was measured, the difference between the top and bottom of the convex-concave surface was 60 through 70 nm at maximum.

When the surface of the ZnSe film of the outermost layer was observed with an atomic force microscope and the surface roughness was measured, the value was 120 through 140 nm using the same measurement method as mentioned above.

When the absorption (for a carbon dioxide laser) of the lens having these anti-reflective films was measured, the value was within the range from 0.27 to 0.29% inclusive. The absorption was measured by using a sample in which anti-reflective films had been formed on both surfaces of the lens substrate.

As described above, according to the invention, an infrared laser optical element can be obtained in which the laser beam absorption can be lowered to 0.15% at most, a highly dense and moisture resistant $BaF_2$ film is provided, and so its durability improved.

In the embodiment, a lens is described as an example of the optical element, however, even in case where a mirror or the like is applied instead of a lens as an optical element, the same effects can be achieved. That is, instead of the lens, even in case of using other optical elements such as an output coupling mirror, rear mirror, beam splitter, phase retardation mirror, bending mirror and the like, comprising optical coated multi-layered film, the effects of the invention can be achieved.

The disclosed embodiment should be considered not to be a limitation but to be an illustration in all respects. The scope of the invention is not shown by the above-mentioned embodiment, but is shown by Claims, and the scope shall be intended to include all amendments and changes within the meanings equivalent to those of the Claims and within the scope of the Claims.

What is claimed is:

1. An infrared laser optical element comprising:

an optical substrate having a main surface;

A BaF2 film formed on the main surface of said optical substrate; and a ZnSe film formed on said BaF2 film, wherein said main surface of the optical substrate has been smoothed and said infrared laser optical element has absorption for infrared laser ranges from 0.09% to 0.15% inclusive.

2. An infrared laser optical element according to claim 1, wherein said optical substrate contains ZnSe.

3. An infrared laser optical element according to claim 1, wherein the thickness of said ZnSe film is less than that of said $BaF_2$ film.

4. An infrared laser optical element according to claim 1, containing a multi-layered film consisting of said $BaF_2$ and said ZnSe films.

5. An infrared laser optical element, wherein the main surface of an optical substrate containing ZnSe has been smoothed;

a multi-layered film consisting of a $BaF_2$ and a ZnSe films is formed on said main surface of the substrate that has been smoothed; and the absorption for infrared laser beams thereof ranges from 0.09% to 0.15% at the wavelength from 5 $\mu$m to 12 $\mu$m inclusive.

* * * * *